(12) United States Patent
Chu et al.

(10) Patent No.: US 10,526,512 B2
(45) Date of Patent: Jan. 7, 2020

(54) ADHESION ELEMENT WITH VARIABLE SURFACE ADHESIVE FORCE AND METHOD OF MANUFACTURING THE SAME

(71) Applicant: National Taiwan University of Science and Technology, Taipei (TW)

(72) Inventors: Jinn P. Chu, Taipei (TW); Chien-Kuang Chen, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 0 days.

(21) Appl. No.: 16/150,940

(22) Filed: Oct. 3, 2018

(65) Prior Publication Data
US 2019/0367781 A1   Dec. 5, 2019

(30) Foreign Application Priority Data

May 31, 2018   (TW) ............................... 107118834 A

(51) Int. Cl.
| | |
|---|---|
| *B32B 3/30* | (2006.01) |
| *C09J 7/50* | (2018.01) |
| *C09J 7/20* | (2018.01) |
| *C23C 14/34* | (2006.01) |
| *B32B 15/04* | (2006.01) |
| *B32B 17/06* | (2006.01) |
| *B82Y 30/00* | (2011.01) |
| *B32B 15/20* | (2006.01) |

(52) U.S. Cl.
CPC .   *C09J 7/50* (2018.01); *C09J 7/20* (2018.01); *C23C 14/34* (2013.01); *B32B 3/30* (2013.01); *B32B 15/043* (2013.01); *B32B 15/20* (2013.01); *B32B 17/061* (2013.01); *B32B 2255/205* (2013.01); *B32B 2305/02* (2013.01); *B32B 2405/00* (2013.01); *B82Y 30/00* (2013.01); *C09J 2201/626* (2013.01); *Y10T 428/24182* (2015.01)

(58) Field of Classification Search
CPC ..... Y10T 428/24182; B32B 3/12; B32B 3/14; B32B 3/16; B32B 3/26; B32B 3/30; B32B 15/043; B32B 17/061; B32B 2405/00; C09J 7/00; C09J 2201/626; B82Y 30/00
See application file for complete search history.

(56) References Cited

U.S. PATENT DOCUMENTS

2004/0076822 A1*   4/2004   Jagota .................. C09J 5/00
428/364

\* cited by examiner

*Primary Examiner* — Alexander S Thomas
(74) *Attorney, Agent, or Firm* — Muncy, Geissler, Olds & Lowe, P.C.

(57) ABSTRACT

An adhesion element with variable surface adhesive force comprises a substrate, a heating layer, a buffer layer and a nanostructure array. The heating layer is formed on one side of the substrate, wherein a temperature of the heating layer is changeable by a power supply. The buffer layer is formed on the heating layer. The nanostructure array is formed on the buffer layer, and the nanostructure array is made of a metallic glass material and comprises a plurality of nanostructures which are spaced apart from one another and together form an ordered array. The plurality of gas chambers are formed by the nanostructure array.

13 Claims, 6 Drawing Sheets

ADHESION ELEMENT WITH VARIABLE SURFACE ADHESIVE FORCE AND METHOD OF MANUFACTURING THE SAME

CROSS-REFERENCE TO RELATED APPLICATION

This application claims the priority benefits of Taiwan Patent Application No. 107118834, filed on May 31, 2018, the entirety of which is hereby incorporated by reference herein and made a part of this specification.

BACKGROUND OF THE INVENTION

1. Field of the Invention

The present disclosure generally relates to an adhesion element with variable surface adhesive force, and more particularly to an adhesion element with variable surface adhesive force which can be adjusted by a change in temperature. The present disclosure further comprises a method of manufacturing the adhesion element with variable surface adhesive force.

2. Description of Related Art

In recent years, bionics has become a research target for scholars and inventors. Bionics are applied to fields such as medicine, materials science, agriculture, engineering science and technology to solve the problems encountered in human life by observing and analyzing the body structures, characteristics, and behaviors of animals in nature. For example, the bottom of a limb of a gecko has a large number of adhesive structures, which are nano-scale fluff structures. The gecko can freely control the adhesion of the limbs to a wall or a vertical plane so as to climb the wall or the vertical plane. If this characteristic can be applied in human life, it will be helpful for future sports or work requiring climbing. Therefore, there is a need to provide a component with a variable surface adhesive force like that of a gecko limb.

SUMMARY OF THE INVENTION

A primary object of this disclosure is to provide an adhesion element with variable surface adhesive force which is capable of being adjusted by a change in the temperature of the adhesion element.

To achieve the aforesaid and other objects, the adhesion element with variable surface adhesive force of this disclosure comprises a substrate, a heating layer, a buffer layer and a nanostructure array. The heating layer is formed on one side of the substrate, wherein a temperature of the heating layer is changeable by a power supply. The buffer layer is formed on the heating layer. The nanostructure array is formed on the buffer layer, and the nanostructure array is made of a metallic glass material and comprises a plurality of nanostructures which are spaced apart from one another and together form an ordered array. The plurality of gas chambers are formed by the nanostructure array.

In one embodiment of this disclosure, the heating layer comprises a metallic layer, and the buffer layer comprises a metal oxide layer or a nitride layer.

In one embodiment of this disclosure, each nanostructure comprises a hollow tubular structure with a central axis perpendicular to a surface of the buffer layer; one end of the hollow tubular structure is connected to the buffer layer, and the other end of the hollow tubular structure is an open end.

In one embodiment of this disclosure, a diameter of the hollow tubular structure ranges from 10 nm to 100 μm, and a height-to-width ratio of the hollow tubular structure ranges from 1:0.5 to 1:10.

In one embodiment of this disclosure, a wall thickness-to-diameter ratio of the hollow tubular structure ranges from 1:2 to 1:10.

In one embodiment of this disclosure, a duty ratio of the plurality of nanostructures ranges from 0.5 to 6.

In one embodiment of this disclosure, the adhesion element with variable surface adhesive force of this disclosure further comprises a power supply unit electrically connected to the heating layer for applying an adjustable voltage to the heating layer.

In one embodiment of this disclosure, the adjustable voltage ranges from 0.5V to 3V.

In one embodiment of this disclosure, the surface adhesive force of the nanostructure array to the object is reduced with an increase in the adjustable voltage.

In one embodiment of this disclosure, under the same adjustable voltage, the surface adhesive force of the nanostructure array to the object during a temperature increase is less than the surface adhesive force of the nanostructure array to the object during a temperature decrease.

In one embodiment of this disclosure, the metallic glass material comprises at least one material selected from the group consisting of a zirconium-based metallic glass, a titanium-based metallic glass, a palladium-based metallic glass, an iron-based metallic glass, a copper-based metallic glass, a nickel-based metallic glass, an aluminum-based metallic glass, a tungsten-based metallic glass, and a magnesium-based metallic glass.

Another object of this disclosure is to provide the method of manufacturing the adhesion element with variable surface adhesive force. The method comprises: providing a substrate; forming a heating layer on the substrate; forming a buffer layer on the heating layer; forming a photoresist layer on the buffer layer, wherein the photoresist layer comprises a hollow structure array, and the hollow structure array comprises a plurality of hollow structures which pass through from one side of the photoresist layer to the buffer layer; sputtering a metallic glass material on the photoresist layer to deposit the metallic glass material on a side wall of each hollow structure and a part of the buffer layer defined by the side wall; and removing the photoresist layer to form a nanostructure array of the metallic glass material, wherein the nanostructure array comprises a plurality of nanostructures which are spaced apart from one another and form an ordered array, and a plurality of gas chambers are formed by the nanostructure array.

In one embodiment of this disclosure, the method further comprises: electrically connecting a power supply unit to the heating layer to provide an adjustable voltage to the heating layer.

BRIEF DESCRIPTION OF THE DRAWINGS

The accompanying drawings are included to provide further understanding of the invention and are incorporated in and constitute a part of this specification. The drawings illustrate embodiments of the invention and, together with the descriptions, serve to explain the principles of the invention.

DESCRIPTION OF THE EMBODIMENTS

Since various aspects and embodiments are merely exemplary and not limiting, after reading this specification, skilled artisans will appreciate that other aspects and embodiments are possible without departing from the scope of the disclosure. Other features and benefits of any one or more of the embodiments will be apparent from the following detailed description and the claims.

As used herein, the terms "comprises," "comprising," "includes," "including," "has," "having" or any other variation thereof are intended to cover a non-exclusive inclusion. For example, a component, structure, article, or apparatus that comprises a list of elements is not necessarily limited to only those elements but may include other elements not expressly listed or inherent to such component, structure, article, or apparatus.

Figure 1:
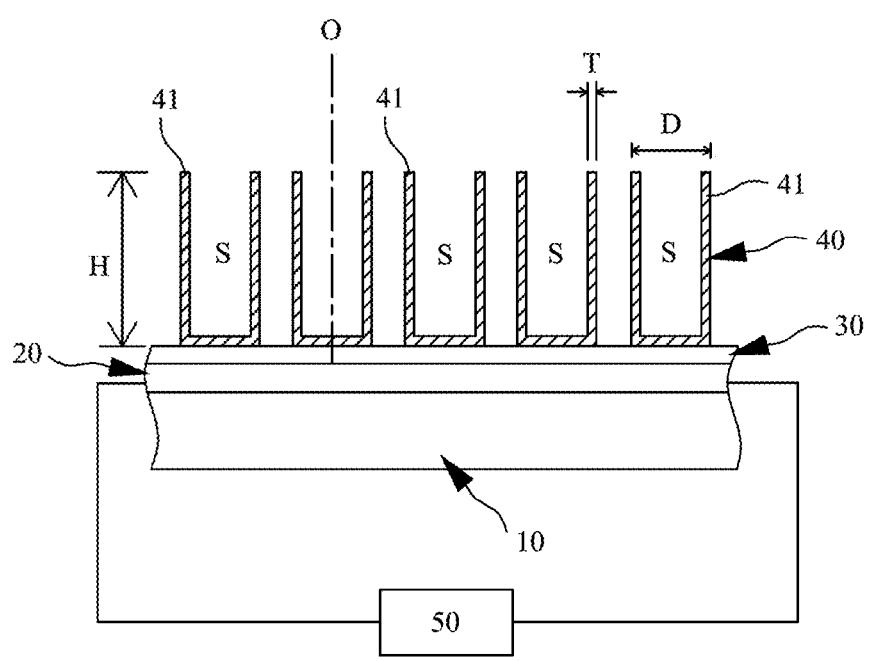
FIG. 1 illustrates a structural configuration of an adhesion element with variable surface adhesive force of this disclosure.

Refer to FIG. 1, which illustrates a structural configuration of an adhesion element with variable surface adhesive force of this disclosure. As illustrated in FIG. 1, the adhesion element with variable surface adhesive force 1 of this disclosure comprises a substrate 10, a heating layer 20, a buffer layer 30 and a nanostructure array 40. In one embodiment of this disclosure, the substrate 10 may comprise a silicon wafer, but the substrate 10 may also comprise a III-V semiconductor, glass, quartz, sapphire or the like. The substrate 10 may further comprise plastic or other polymer materials. The material of the substrate 10 is selected depending on different needs, but this disclosure is not limited thereto.

The heating layer 20 is formed on one side of the substrate 10. The heating layer 20 may be heated and cooled with the presence and absence of an applied voltage respectively, such that the temperature of the heating layer 20 is changed. The heating layer 20 is capable of being electrically connecting to a power supply unit 50 for applying required voltages to the heating layer 20. The heating layer 20 comprises a metallic layer, and the metallic layer is mainly made of a metal having high electrical and thermal conductivity. In one embodiment of this disclosure, the heating layer 20 comprises an aluminum layer, but this disclosure is not limited thereto.

The buffer layer 30 is formed on the heating layer 20. The buffer layer 30 is formed on the side of the heating layer 20 opposite to the side of the heating layer 20 connected to the substrate 10. The buffer layer 30 serves as a combination medium between the heating layer 20 and the nanostructure array 40, such that the nanostructure array 40 and the heating layer 20 can be combined easily and prevented from separation. The buffer layer 30 comprises a metal oxide layer or a nitride layer; for example, in one embodiment of this disclosure, the buffer layer 30 comprises an aluminum layer, but this disclosure is not limited thereto.

The nanostructure array 40 is formed on the buffer layer 30. The nanostructure array 40 is formed on the side of the buffer layer 30 opposite to the side of the buffer layer 30 connected to the heating layer 20. The nanostructure array 40 comprises a plurality of nanostructures 41. An ordered array is composed of the plurality of nanostructures 41. Here, the term "ordered" refers to the plurality of nanostructures 41 all being oriented in the same direction and arranged by a fixed and repetitive periodicity. In addition, a plurality of gas chambers S are formed by the nanostructure array 40. Each gas chamber S may be formed by each nanostructure 41, such as a hollow structure of each nanostructure 41, or may be formed by gaps between two adjacent nanostructures 41.

In one embodiment of this disclosure, each nanostructure 41 comprises a hollow tubular structure. The hollow tubular structure has a central axis O perpendicular to a surface of the buffer layer 30. One end of the hollow tubular structure is connected to the buffer layer 30 to form a closed end, and the other end of the hollow tubular structure is an open end having an opening. A hollow portion of each hollow tubular structure serves as the gas chamber S, and a gap formed between two adjacent hollow tubular structures may also serve as the gas chamber S. Each hollow tubular structure has a diameter D, a height H, and a wall thickness T. In one embodiment of this disclosure, the diameter D of each hollow tubular structure ranges from 10 nm to 100 μm, and the preferred range is from 500 nm to 800 nm. A height-to-width ratio (H:D) of each hollow tubular structure ranges from 1:0.5 to 1:10, and the preferred range is from 1:0.5 to 1:4. In addition, a wall thickness-to-diameter ratio (T:D) of each hollow tubular structure ranges from 1:2 to 1:10.

A fixed distance is defined between any two adjacent nanostructures 41 of the plurality of nanostructures 41. In one embodiment of this disclosure, a duty ratio of the plurality of nanostructures 41 ranges from 0.5 to 6. In other words, a minimum distance between any two adjacent nanostructures 41 is 0.5 times the diameter D of a hollow tubular structure, and a maximum distance between any two adjacent nanostructures 41 is 6 times the diameter D of the hollow tubular structure, but this disclosure is not limited thereto. The preferred duty ratio of the plurality of nanostructures 41 ranges from 0.5 to 2.

Here, the nanostructure array 40 may comprise a metallic glass material. The metallic glass material comprises at least one material selected from the group consisting of: a zirconium-based metallic glass, a titanium-based metallic glass, a palladium-based metallic glass, an iron-based metallic glass, a copper-based metallic glass, a nickel-based metallic glass, an aluminum-based metallic glass, a tungsten-based metallic glass, and a magnesium-based metallic glass, but this disclosure is not limited thereto. In one embodiment of this disclosure, the zirconium-based metallic glass comprises 37-66 at % zirconium. For example, the zirconium-based metallic glass may comprise a ZrAlCo metallic glass (Zr: 54-60 at %, Al: 13-22 at % and Co: 18-30 at %), a ZrCuAlNi metallic glass (Zr: 48-66 at %, Cu: 7-30 at %, Al: 8-12 at % and Ni: 5-18 at %), a ZrCuAlTa metallic glass (Zr: 48-66 at %, Cu: 7-30 at %, Al: 8-12 at % and Ta: 5-18 at %), a ZrCuAlAg metallic glass (Zr: 48-66 at %, Cu: 7-30 at %, Al: 8-12 at % and Ag: 5-18 at %), a ZrCuAlNiTi metallic glass (Zr: 55-66 at %, Cu: 10-27 at %, Al: 8-12 at %, Ni: 8-14 at % and Ti: 2-5 at %), a ZrAlCuTiBe metallic glass (Zr: 37-55 at %, Cu: 10-20 at %, Al: 8-10 at %, Ti: 10-14 at % and Be:

12-25 at %), a ZrCuAlNiSi metallic glass (Zr: 55-66 at %, Cu: 25-30 at %, Al: 11-18 at %, Ni: 5-10 at % and Si: 0.5-1 at %), a ZrCuAlNiNb metallic glass (Zr: 55-66 at %, Cu: 10-27 at %, Al: 8-12 at %, Ni: 8-14 at % and Nb: 6-12 at %), a ZrHfTiCuNiAl metallic glass (Zr: 40-45 at %, Hf: 8-11 at %, Ti: 2-5 at %, Cu: 10-18 at %, Ni: 10-15 at % and Al: 5-10 at %) or a ZrTiCuNiBeYMg metallic glass (Zr: 40-45 at %, Ti: 10-15 at %, Cu: 11-18 at %, Ni: 11-15 at %, Be: 22-26.5 at %, Y: 1-2 at % and Mg: 0.5-1 at %).

In one embodiment of this disclosure, the titanium-based metallic glass comprises 23-53 at % titanium. For example, the titanium-based metallic glass may comprise a TiZrCuNbCo metallic glass (Ti: 42-50 at %, Zr: 18-24 at %, Cu: 20-30 at %, Nb: 3-5 at % and Co: 1-8 at %), a TiZrCuNi metallic glass (Ti: 32-40 at %, Zr: 7-15 at %, Cu: 20-35 at % and Ni: 3-18 at %), a TiNiCuSnBe metallic glass (Ti: 42-50 at %, Ni: 18-24 at %, Cu: 20-30 at %, Sn: 3-5 at % and Be: 1-8 at %), a TiZrHfNiCu metallic glass (Ti: 23-28 at %, Zr: 21-26 at %, Hf: 16-21 at %, Ni: 11-16 at % and Cu: 9-14 at %), a TiCuNiSiB metallic glass (Ti: 42-50 at %, Cu: 18-24 at %, Ni: 20-30 at %, Si: 3-12 at % and B: 1-2 at %), a TiZrNiCuBe metallic glass (Ti: 40-45 at %, Zr: 18-25 at %, Ni: 15-25 at %, Cu: 9-25 at % and Be: 3-7 at %) or a TiCuNiZrAlSiB metallic glass (Ti: 50-53 at %, Cu: 20-27 at %, Ni: 13-24 at %, Si: 3-5 at % and B: 1-2 at %).

In one embodiment of this disclosure, the palladium-based metallic glass comprises 40-82 at % palladium. For example, the palladium-based metallic glass may comprise a PdCuSi metallic glass (Pd: 56-82 at %, Cu: 2-27 at % and Si: 15-17 at %), a PdNiP metallic glass (Pd: 40-42 at %, Ni: 40-42 at % and P: 16-20 at %) or a PdNiCuP metallic glass (Pd: 40-50 at %, Ni: 7-15 at %, Cu: 20-35 at % and P: 10-20 at %).

In one embodiment of this disclosure, the iron-based metallic glass comprises 30-67 at % iron. For example, the iron-based metallic glass may comprise an FeCoSmB metallic glass (Fe: 60-67 at %, Co: 7-10 at %, Sm: 2-4 at % and B: 20-25 at %), an FeCoTbB metallic glass (Fe: 61-67 at %, Co: 7-10 at %, Tb: 2-4 at % and B: 20-25 at %), an FeCoNdDyB metallic glass (Fe: 61-67 at % Co: 7-10 at %, Nd: 2-4 at %, Dy: 0.5-1 at % and B: 20-25 at %), an FeCoNiZrB metallic glass (Fe: 60-67 at %, Co: 7-10 at %, Ni: 2-4 at %, Zr: 0.5-1 at % and B: 20-25 at %), an FeCoNiSiB metallic glass (Fe: 30-40 at %, Co: 25-30 at %, Ni: 8-15 at %, Si: 5-8 at % and B: 15-25 at %), a FeZrCoMoWB metallic glass (Fe: 25-30 at %, Zr: 15-25 at %, Co: 6-10 at %, Mo: 3-8 at %, W: 15-25 at % and B: 10-22 at %) or a FeCrMoErCB metallic glass (Fe: 48-56 at %, Cr: 5-15 at %, Mo: 14-18 at %, Er: 1-3 at %, C: 12-15 at % and B: 2-12 at %).

In one embodiment of this disclosure, the copper-based metallic glass comprises 40-65 at % copper. For example, the copper-based metallic glass may comprise a CuHfTi metallic glass (Cu: 50-60 at %, Hf: 15-30 at % and Ti: 10-25 at %), a CuZrAl metallic glass (Cu: 50-60 at %, Zr: 15-30 at % and Al: 10-25 at %), a CuZrNb metallic glass (Cu: 52-57 at %, Zr: 40-45 at % and Nb: 1-3 at %), a CuZrAlAg metallic glass (Cu: 48-65 at %, Zr: 23-35 at %, Al: 7-20 at % and Ag: 2-20 at %), a CuZrTiNi metallic glass (Cu: 40-48 at %, Zr: 11-20 at %, Ti: 27-34 at % and Ni: 5-8 at %), a CuZrAlY metallic glass (Cu: 40-48 at %, Zr: 40-45 at %, Al: 5-10 at % and Y: 2-5 at %), a CuZrAlTi metallic glass (Cu: 50-60 at %, Zr: 15-20 at %, Al: 5-8 at % and Ti: 12-25 at %) or a CuZrHfTi metallic glass (Cu: 50-60 at % Zr: 15-20 at %, Hf: 8-15 at % and Ti: 8-15 at %).

In one embodiment of this disclosure, the nickel-based metallic glass comprises 35-65 at % nickel. For example, the nickel-based metallic glass may comprise a NiZrAl metallic glass (Ni: 55-57 at %, Zr: 28-35 at % and Al: 8-17 at %), a NiNbTa metallic glass (Ni: 55-60 at %, Nb: 25-30 at % and Ta: 10-20 at %), a NiNbSn metallic glass (Ni: 55-60 at %, Nb: 32-40 at % and Sn: 5-10 at %), a NiNbHfTi metallic glass (Ni: 57-62 at %, Nb: 8-20 at %, Hf: 5-10 at % and Ti: 15-20 at %), a NiZrAlNb metallic glass (Ni: 57-62 at %, Nb: 13-25 at %, Al: 3-5 at % and Ti: 15-20 at %), a NiZrTiAl metallic glass (Ni: 45-57 at %, Zr: 20-27 at %, Ti: 16-20 at % and Al: 5-8 at %), a NiZrTiPd metallic glass (Ni: 55-57 at %, Zr: 20-25 at %, Ti: 10-18 at % and Al: 3-10 at %), a NiNbTiZr metallic glass (Ni: 57-62 at %, Nb: 8-25 at %, Ti: 15-20 at % and Zr: 3-10 at %), a NiCuZrTiAl metallic glass (Ni: 35-45 at %, Cu: 5-15 at %, Zr: 25-35 at %, Ti: 5-10 at % and Al: 8-15 at %), a NiCuZrTiAlSi metallic glass (Ni: 35-45 at %, Cu: 5-15 at %, Zr: 25-35 at %, Ti: 5-10 at %, Al: 8-15 at % and Si: 0.5-1 at %) or a NiNbCrMoPB metallic glass (Ni: 60-65 at %, Nb: 2-10 at %, Cr: 2-9 at %, Mo: 3-11 at %, P: 8-19 at % and B: 2-11 at %).

In one embodiment of this disclosure, the aluminum-based metallic glass comprises 68-85 at % aluminum. For example, the aluminum-based metallic glass may comprise an AlNiMm metallic glass (Al: 68-70 at %, Ni: 20-22 at % and Mm: 8-12 at %), an AlNiY metallic glass (Al: 75-85 at %, Ni: 5-20 at % and Y: 5-12 at %), a AlVM metallic glass (Al: 68-70 at %, V: 20-22 at % and M: 8-12 at %), an AlNiCe metallic glass (Al: 68-70 at %, Ni: 20-22 at % and Ce: 8-12 at %), a AlCoY metallic glass (Al: 68-70 at %, Co: 20-22 at % and Y: 8-12 at %), an AlNiYZrCo metallic glass (Al: 75-80 at %, Ni: 6-15 at %, Y: 6-8 at %, Zr: 1-2 at % 及 Co: 2-4 at %) or an AlNiYCoCu metallic glass (Al: 75-80 at %, Ni: 6-15 at %, Y: 6-8 at %, Co: 2-4 at % and Cu: 1-2 at %).

In one embodiment of this disclosure, the tungsten-based metallic glass comprises 50-55 at % tungsten. For example, the tungsten-based metallic glass may comprise a WNiB metallic glass (W: 50-55 at %, Ni: 25-27 at % and B: 20-25 at %) or a WZrSi metallic glass (W: 50-55 at %, Ni: 25-27 at % and Si: 20-25 at %).

In one embodiment of this disclosure, the magnesium-based metallic glass comprises 60-80 at % magnesium. For example, the magnesium-based metallic glass may comprise a MgCuY metallic glass (Mg: 60-65 at %, Cu: 25-30 at % and Y: 8-15 at %), a MgNiNd metallic glass (Mg: 75-80 at %, Ni: 10-18 at % and Nd: 7-15 at %), a MgCuGd metallic glass (Mg: 60-65 at %, Cu: 25-30 at % and Gd: 8-15 at %), a MgAlCuY metallic glass (Mg: 60-65 at %, Al: 8-10 at %, Cu: 20-25 at % and Y: 5-10 at %), a MgCuYSi metallic glass (Mg: 60-65 at %, Cu: 23-30 at %, Y: 8-10 at % and Si: 1-2 at %), a MgCuZnY metallic glass (Mg: 60-65 at %, Cu: 23-30 at %, Zn: 1-2 at % and Y: 8-10 at %) or a MgCuNiZnAgY metallic glass (Mg: 60-65 at %, Cu: 5-10 at %, Ni: 5-10 at %, Zn: 3-9 at %, Ag: 3-5 at % and Y: 8-10 at %).

The three-dimensional nanostructure array 40 may provide a larger surface area than a planar structure of metallic glass material, and the three-dimensional nanostructure array 40 may contain air. The amount of air contained in the nanostructure array 40 is changeable according to the size of the nanostructures 41. A surface adhesive force to an object may be provided by the air contained in the nanostructure array 40.

In addition, in one embodiment of this disclosure, the adhesion element with variable surface adhesive force 1 of this disclosure further comprises a power supply unit 50. The power supply unit 50 is electrically connected to the heating layer 20. The power supply unit 50 comprises a variable power source for applying an adjustable voltage to the heating layer 20, such that the temperature of the heating layer 20 may be changed by supplying power. In this embodiment, the power supply unit 50 may be a power supply, a battery module, or other power supply device capable of supplying an adjustable voltage. In one embodiment of this disclosure, the adjustable voltage ranges from 0.5V to 3V.

Figure 2:
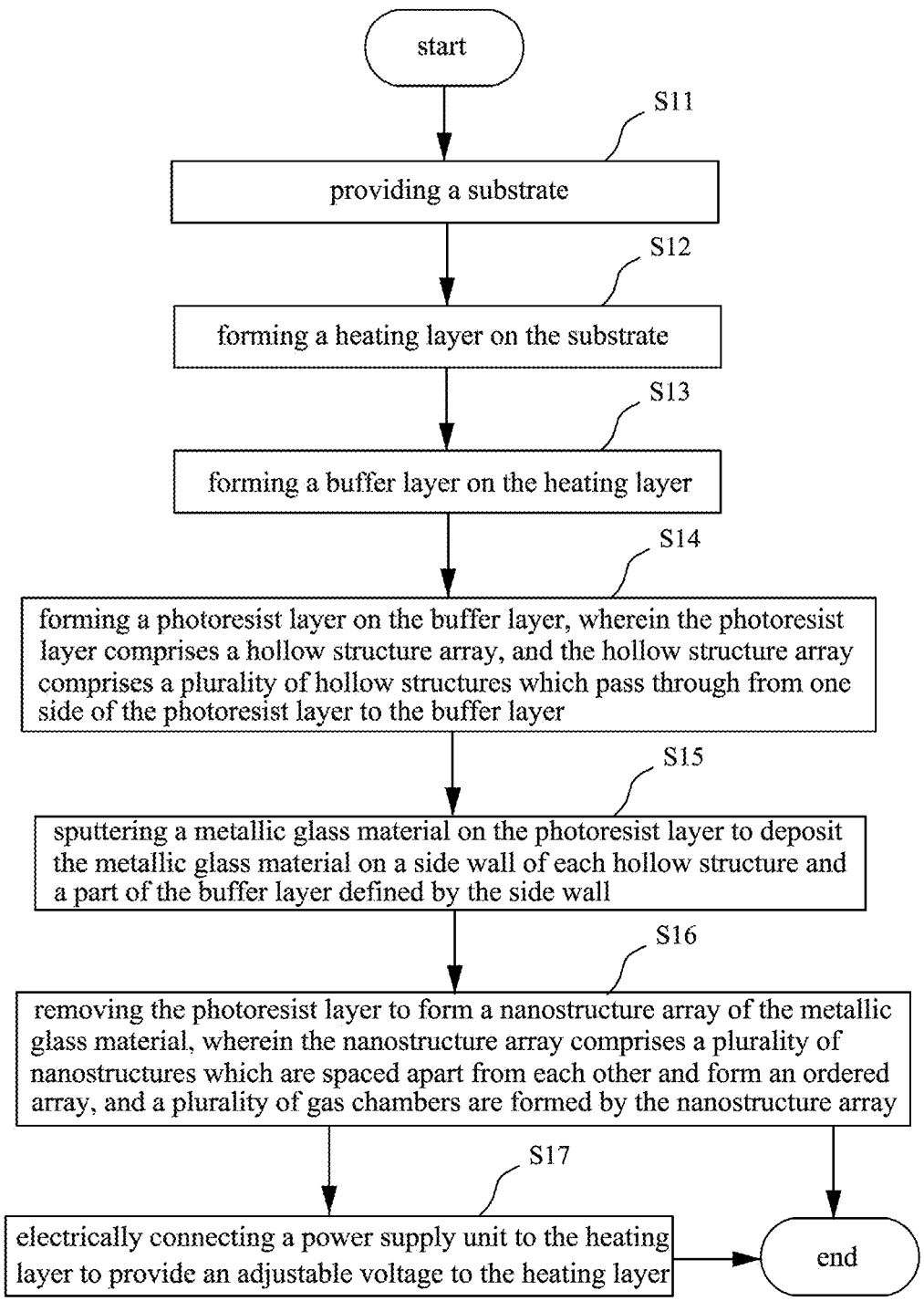
FIG. 2 illustrates a flowchart of a method of manufacturing the adhesion element with variable surface adhesive force of this disclosure.
Figure 3:
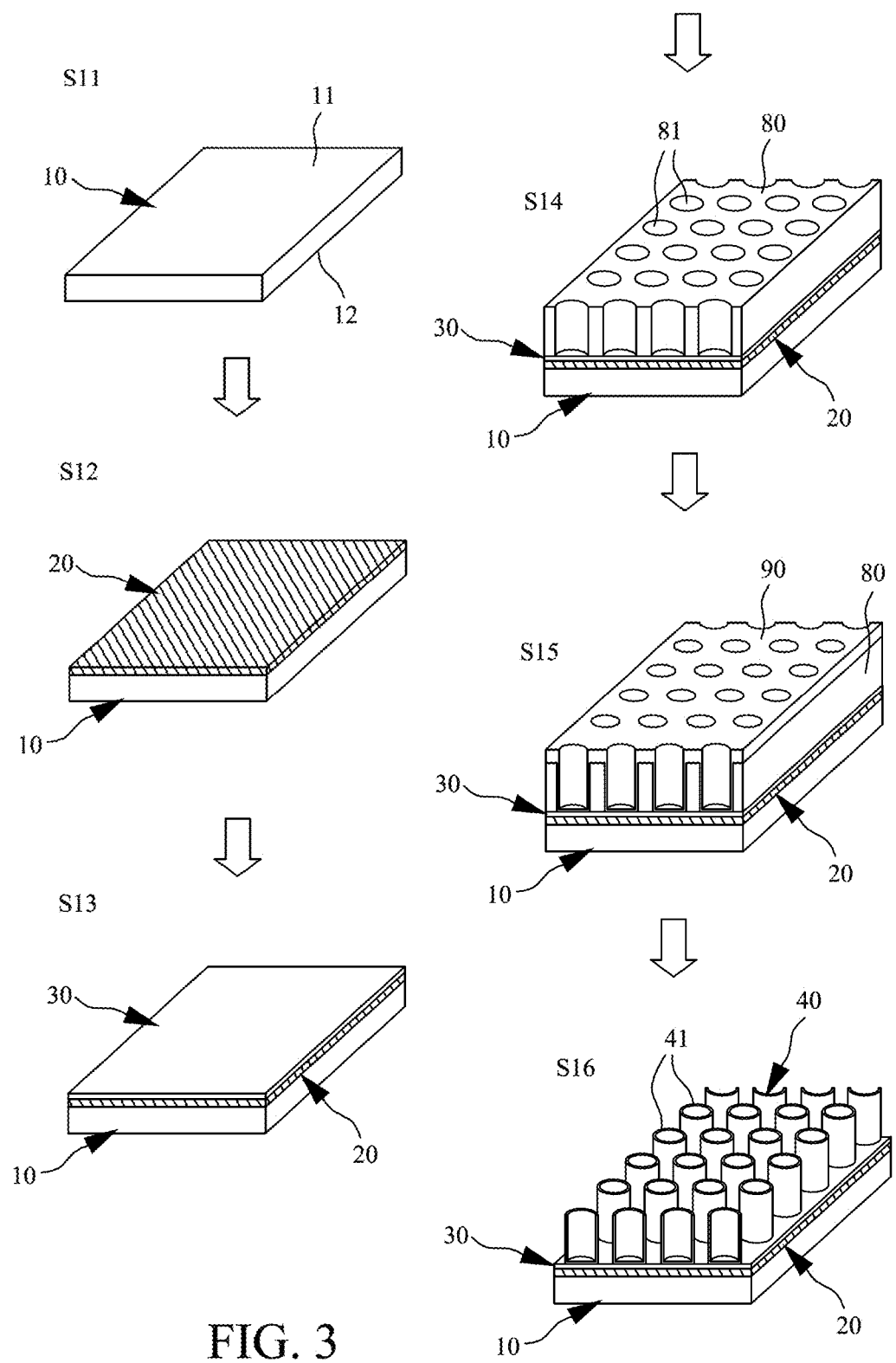
FIG. 3 illustrates a structural configuration corresponding to each step of the method of manufacturing the adhesion element with variable surface adhesive force of this disclosure.

Now refer to FIG. 2 and FIG. 3. FIG. 2 illustrates a flowchart of a method of manufacturing an adhesion element with variable surface adhesive force of this disclosure, and FIG. 3 illustrates a structural configuration corresponding to each step of the method of manufacturing the adhesion element with variable surface adhesive force of this disclosure. As illustrated in FIG. 2 and FIG. 3, the method of manufacturing the adhesion element with variable surface adhesive force of this disclosure comprises Steps S11 to S16, which are described in detail below.

Step S11: Providing a substrate.

First, a suitable substrate 10 is provided according to the use requirements of the adhesion element with variable surface adhesive force 1 of this disclosure. Here, the substrate 10 may be a prepared sheet or block material having a fixed size. In this disclosure, the substrate 10 is a silicon wafer, but this disclosure is not limited thereto, and the substrate 10 may be any object having a surface on which a heating layer is formed. The substrate 10 comprises a first side 11 and a second side 12 opposite to the first side 11. In this embodiment, the area of the substrate 10 is about 1 square centimeter, but the size of the substrate 10 of this disclosure is not limited thereto. A cleaning process may be performed on the silicon wafer serving as the substrate 10 so as to remove dust or organic contaminants on the surface, and then a hexamethyldioxane treatment may be performed on the silicon wafer.

Step S12: Forming a heating layer on the substrate.

After the substrate 10 has been provided in Step S11, the heating layer 20 is formed on the first side 11 of the substrate 10. In one embodiment of this disclosure, the heating layer 20 is formed on the first side 11 of the substrate 10 by a radio frequency sputtering process. The sputtering process is performed by using a radio frequency magnetron sputtering system, such as the ULVAC Sputter SBH-3308RDE. The sputtering process is performed for about 20 minutes on the first side 11 of the substrate 10 with an aluminum target, and the operating conditions for the sputtering system are set at a base pressure of about $4.6*10^{-4}$ mTorr, a sputtering distance of about 150 mm, and a radio frequency power of 1500 W in an argon atmosphere. In this embodiment, the thickness of the heating layer 20 is about 310 nm, but the thickness of the heating layer 20 may be adjusted according to different heating requirements.

Step S13: Forming a buffer layer on the heating layer.

After the heating layer 20 has been formed in Step S12, the buffer layer 30 is formed on the heating layer 20. In one embodiment of this disclosure, a thin film of silicon nitride is deposited on the surface of the heating layer 20 (i.e., the opposite side of the heating layer 20 in contact with the substrate 10) to form the buffer layer under a gas mixture of nitrogen and silicon hydride by plasma-enhanced chemical vapor deposition. In this embodiment, the thickness of the buffer layer 30 is about 350 nm, but the thickness of the buffer layer 30 may be adjusted according to different needs.

Step S14: forming a photoresist layer on the buffer layer, wherein the photoresist layer comprises a hollow structure array, and the hollow structure array comprises a plurality of hollow structures which pass through from one side of the photoresist layer to the buffer layer.

The following steps will be described below for the embodiment in which each nanostructure 41 of the nanostructure array 40 is a hollow tubular structure. After the buffer layer 30 has been provided in Step S13, the photoresist layer 80 is formed on the buffer layer 30. In one embodiment of this disclosure, the photoresist layer 15 comprises photoresist formed on the surface of the buffer layer 30 (i.e., the opposite side of the buffer layer 30 in contact with the heating layer 20) by spin coating. A photolithography process is performed on the photoresist layer 80 to form a hollow structure array. The hollow structure array comprises a plurality of hollow structures 81. The plurality of hollow structures 81 are arranged in a regular order, and each hollow structure 81 passes through from one side of the photoresist layer 80 (i.e., the opposite side of the photoresist layer 80 in contact with the buffer layer 30) to the buffer layer 30. In this embodiment, the thickness of the photoresist layer 80 is about 780 nm, but the thickness of the photoresist layer 80 can be adjusted to adjust the height of each nanostructure of the subsequently formed nanostructure array. In addition, each hollow structure 81 comprises a circular hole. The diameter of each hollow structure 81 can also be adjusted to adjust the diameter of each nanotube of the subsequently formed nanotube array structure.

Step S15: Sputtering a metallic glass material on the photoresist layer to deposit the metallic glass material on a side wall of each hollow structure and a part of the buffer layer defined by the side wall.

After the photoresist layer 80 has been formed in Step S14, a sputtering process is performed. The metallic glass material is sputtered on the photoresist layer 80 to form a deposition layer 90 by a sputtering target made of the metallic glass material (for example, an alloyed target of $Zr_{55}Cu_{30}Al_{10}Ni_5$). The metallic glass material is deposited on a side wall of each hollow structure 81 and a part of the buffer layer 30 defined by the side wall of each hollow structure 81. In one embodiment of this disclosure, the sputtering process is performed by using a radio frequency magnetron sputtering system. The sputtering process is performed for about 225 to 675 seconds on the photoresist layer 80 by the target made of the metallic glass material, and the operating conditions for the sputtering system are set at a base pressure of about $5*10^{-4}$ mTorr and a working pressure of about 3 mTorr with a sputtering distance of 10 mm. The thickness of the deposition layer 90 of the metallic glass material on the surface of the photoresist layer 80 and the thickness of the metallic glass material formed on the side wall of each hollow structure 81 may be adjusted depending on the sputtering time. Under the same sputtering time, the thickness of the metallic glass material formed on the side wall of each hollow structure 81 may also be changed by altering the size of the hollow structure 81. In other words, the thickness of the metallic glass material formed on the side wall of each hollow structure 81 may be reduced with an increase in the diameter of the hollow structure 81.

Step S16: Removing the photoresist layer and forming a nanostructure array of the metallic glass material, wherein the nanostructure array comprises a plurality of nanostructures which are spaced apart from one another and form an ordered array, and a plurality of gas chambers are formed by the nanostructure array.

After the metallic glass material has been sputtered on the photoresist layer 80 in Step S15, the excess metallic glass material deposited on the photoresist layer 80 is removed, and a rinsing process is performed with a solvent such as toluene to remove the photoresist layer 80 on the surface of the buffer layer 30. Therefore, the nanostructure array 40 is formed on the buffer layer 30 by the remaining metallic glass material. At this moment, the nanostructure array 40 comprises a plurality of nanostructures 41, which are connected to the buffer layer 30 respectively, and each nanostructure 41 has an open end opposite to the buffer layer 30. The height of each nanostructure 41 is equal to the thickness of the photoresist layer 80, and the diameter of each nanostructure 41 is equal to the diameter of each hollow structure 81 of the photoresist layer 80. For example, in this embodiment, the height of each nanostructure 41 is about 780 nm, the diameter of each nanostructure 41 is about 500 nm, and the wall thickness of each nanostructure 41 is about 100 nm, but this disclosure is not limited thereto.

As illustrated in FIG. 1 and FIG. 2 again, in this embodiment, the method of manufacturing the adhesion element with variable surface adhesive force of this disclosure further comprises Step S17: Electrically connecting a power supply unit to the heating layer to provide an adjustable voltage to the heating layer.

After the nanostructure array 40 have been formed in Step S16, the heating layer 20 of the adhesion element with variable surface adhesive force 1 of this disclosure may be electrically connected to a power supply unit 50. A voltage is provided by the power supply unit 50 so as to increase the temperature of the heating layer 20 such that the heat may be conducted to nanostructure array 40. The voltage provided by the power supply unit 50 to the heating layer 20 is an adjustable voltage. Since the voltage provided by the power supply unit 50 is variable, the range of temperature increase of the heating layer 20 may also be changed so as to control the temperature of the nanostructure array 40. It should be noted that step S17 of the method of manufacturing the adhesion element with variable surface adhesive force of this disclosure may also be performed before step S16. For example, the power supply unit 50 may be electrically connected to the formed heating layer 20 after the heating layer 20 has been formed in Step S12.

Figure 4:
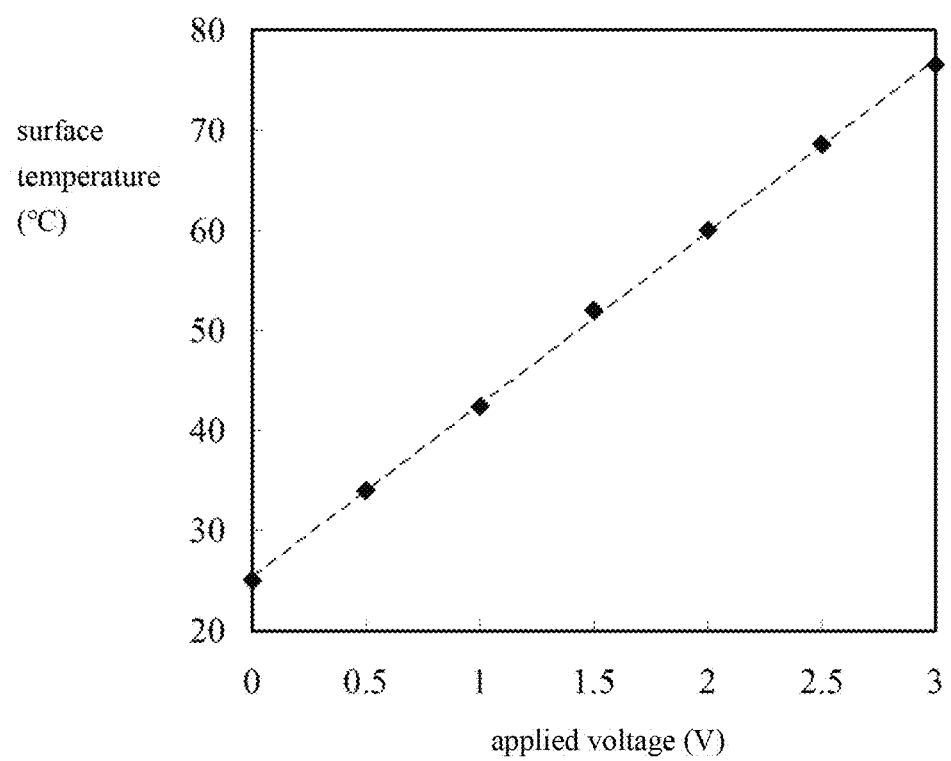
FIG. 4 illustrates the relationship of surface temperature and applied voltage of the adhesion element with variable surface adhesive force of this disclosure.

Refer to FIG. 4, which illustrates the relationship of surface temperature and applied voltage of the adhesion element with variable surface adhesive force of this disclosure. The changes in the surface temperature of the adhesion element with variable surface adhesive force 1 of this disclosure at corresponding voltages were measured by providing different voltages to the heating layer 20. As illustrated in FIG. 4, according to the experimental results, the surface temperature of the adhesion element with variable surface adhesive force 1 of this disclosure is linearly proportional to the voltage. In other words, the surface temperature of the adhesion element with variable surface adhesive force 1 of this disclosure may be relatively increased with increases in the voltage provided to the heating layer 20. In addition, the surface temperature of the adhesion element with variable surface adhesive force 1 of this disclosure is adjustable from 25□ to 800□ when the applied voltage ranges from 0.5V to 3V, as shown in FIG. 4. After the stable voltage has been provided, the surface temperature of the adhesion element with variable surface adhesive force 1 of this disclosure becomes stable. Accordingly, the adhesion element with variable surface adhesive force 1 of this disclosure provides a broad range of surface temperature change with the presence of a lower voltage, such that the surface adhesive force provided by the adhesion element with variable surface adhesive force 1 of this disclosure may be adjusted effectively.

Figure 5:
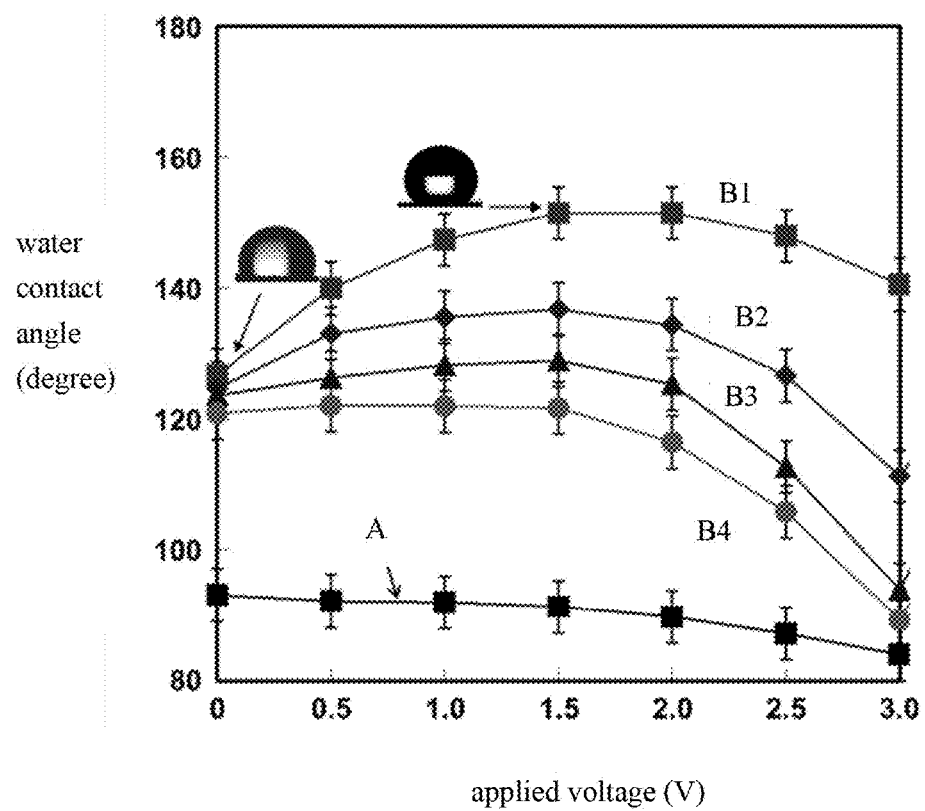
FIG. 5 illustrates water contact angles and applied voltages measured from comparative examples and different experimental examples of the adhesion element with variable surface adhesive force of this disclosure.

Refer to FIG. 5, which illustrates water contact angles and applied voltages measured from comparative examples and different experimental examples of the adhesion element with variable surface adhesive force of this disclosure. In the following experiments, a semi-finished product of the adhesion element with variable surface adhesive force 1 made by the steps S11 to S13 of the method of manufacturing the adhesion element with variable surface adhesive force of this disclosure was used, and a planar metallic glass material layer was formed on the buffer layer 30 of the semi-finished product by sputtering as a comparative example A. Adhesion elements with variable surface adhesive force 1 made by the steps S11 to S16 of the method of manufacturing the adhesion element with variable surface adhesive force of this disclosure were used as experimental examples B1 to B4, and each nanostructure of the experimental examples B1 to B4 was a hollow tubular structure. The diameter of each nanostructure of the experimental example B1 was about 500 nm, the diameter of each nanostructure of the experimental example B1 was about 600 nm, the diameter of each nanostructure of the experimental example B1 was about 700 nm, and the diameter of each nanostructure of the experimental example B1 was about 800 nm. The height of each nanostructure of the experimental examples B1 to B4 was about 780 nm. In this experiment, the surface comprising the metallic glass material of each of the comparative example A and the experimental examples B1 to B4 was wetted by a liquid, such as water, and water contact angles formed by droplets covering the surface comprising the metallic glass material of each of the comparative example A and the experimental examples B1 to B4 were measured. Therefore, the changes in water contact angles at different applied voltages were further analyzed. Here, the term water contact angle refers to a static water contact angle (SWCA), and the water contact angles were measured by increasing the volume of the droplet and recording the angle of the droplet on a GH-100 contact angle system (KRÜSS, Germany) having a rotatable stage.

As illustrated in FIG. 5, in the case of the comparative example A, the droplet formed on the surface of the planar metallic glass material layer without applying any voltage had a maximum water contact angle of about 94±3°. The surface temperature of the planar metallic glass material layer was increased and the surface tension of the water was lowered by gradually increasing the applied voltage to 3V, and the water contact angle of the droplet was gradually reduced. In contrast, in any case of the experimental examples B1 to B4, the water contact angle of the droplet formed on the surface having the nanostructure array without any voltage applied was significantly higher than that of the comparative example A under the same conditions. For example, the water contact angle of the experimental example B1 could reach about 126±4°. The experimental examples B1 to B3 showed a trend of increases in the water contact angle by with gradual increases in the applied voltage to 1.5V, except that the water contact angle of the experimental example B4 slightly decreased. When the applied voltage gradually was increased from 1.5V to 3V, the water contact angles of the experimental examples B1 to B3 began to decrease. Accordingly, the experimental examples B1 to B4 having the nanostructure array surface exhibited a larger water contact angle than the comparative example A having a flat surface. The results obviously indicated that the experimental examples B1 to B4 provided better hydrophobicity of the surface due to the nanostructure array. In other words, each of the experimental examples B1 to B4 provided a large surface adhesive force.

According to the results in FIG. 5, when the liquid covered the surface of any of the experimental examples B1 to B4, closed gas chambers were formed by the plurality of gas chambers of the nanostructure array in any of the experimental examples B1 to B4. When the applied voltage was gradually increased to 1.5V, the surface temperature of the nanostructure array was increased, such that a positive pressure was generated by the gas in the plurality of gas chambers to provide a diffusion force to the droplets, and the surface adhesive force of the nanostructure array was reduced. However, when the applied voltage was gradually increased to 2V and the surface temperature was increased to more than 60° C., the surface tension of the liquid was lowered, and the gas in the plurality of gas chambers could easily escape and cause the droplets to penetrate into the plurality of gas chambers so as to generate a suction force to reduce the water contact angle. Conversely, as the applied voltage was gradually reduced to decrease the surface temperature of the nanostructure array, a negative pressure was generated by the gas in the plurality of gas chambers to provide suction to the droplets such that the surface adhesive force of the nanostructure array was increased.

In addition, it can be inferred from the experimental examples B1 to B4 that the water contact angle exhibited by the nanostructure array became smaller in relation to increases in the diameter of the nanostructure. For example, since the diameter of the nanostructure of experimental example B4 was larger than the diameter of the nanostructure of experimental example B1, the height-to-width ratio, the duty ratio and wall thickness of the nanostructure of experimental example B4 were all smaller than those of experimental example B1. Therefore, gas leakage in the plurality of gas chambers was more likely to occur in the experimental example B4 than in the experimental example B1, and thus the water contact angle of the experimental example B4 was worse than that of the experimental example B1.

The surface adhesive force of the adhesion element with variable surface adhesive force of this disclosure may be calculated by measuring the weight of the droplet suspended from the surface of the nanostructure array in an inverted state. The formula for calculating the surface adhesive force is as follows:

$$P = W/A$$

where P is the surface adhesive force per unit area, W is the maximum weight of the droplet, and A is the contact surface area of the nanostructure array with the droplet. Generally, when the adhesion element with variable surface adhesive force is in a normal state, the pressure in the plurality of gas chambers of the nanostructure array covered by the static droplets is about 1 atm, which is equivalent to the ambient pressure. Once the adhesion element with variable surface adhesive force is inclined from 0° to 90° or 180°, the pressure in the plurality of gas chambers is reduced and the surface adhesive force is generated. During this experiment, the maximum weight of the droplets was determined by gradually increasing the volume of the droplets suspended from the surface of the nanostructure array until the droplets separated from the surface of the nanostructure array.

Figure 6:
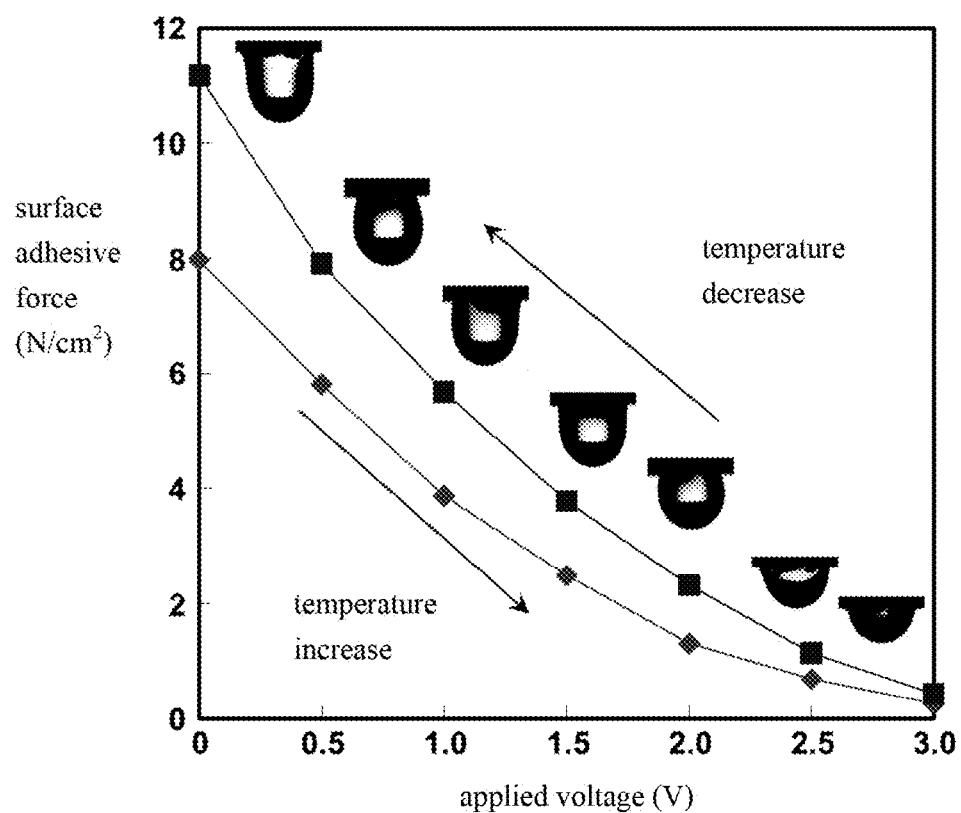
FIG. 6 illustrates surface adhesive forces and applied voltages measured from the experimental example B1.

Please refer to FIG. 6, which illustrates surface adhesive forces and applied voltages measured from the experimental example B1. In the following experiment, the adhesion element with variable surface adhesive force of the experimental example B1 was used as an experimental target, and the relationship between the surface adhesive force and the applied voltage was measured under the conditions of continuously applying a voltage to increase the temperature and stopping the application of the voltage to decrease the temperature. As illustrated in FIG. 6, the surface adhesive force provided by the experimental example B1 without voltage applied was about 8 N/cm$^2$. As the applied voltage was gradually increased, the surface temperature of the nanostructure array gradually increased, and the gas pressure in the plurality of gas chambers of the nanostructure array increased at the same time such that the surface adhesive force was reduced. When the applied voltage was increased to 3V, the surface adhesive force provided by the experimental example B1 was reduced to about 0.26 N/cm$^2$. Accordingly, the surface adhesive force of the nanostructure array to the object was reduced according to the increase in the adjustable voltage.

Conversely, when the applied voltage applied to the experimental example B1 was gradually reduced from 3V, the surface temperature of the nanostructure array was gradually decreased, and the gas pressure in the plurality of gas chambers of the nanostructure array was reduced at the same time such that the surface adhesive force increased. In addition, under the same adjustable voltage, the surface adhesive force of the nanostructure array to the object during the temperature increase was less than the surface adhesive force of the nanostructure array to the object during the temperature decrease. The surface adhesive force provided by the experimental group B1 increased to about 11.2 N/cm$^2$ until the applied voltage was reduced to 0V. Accordingly, the adhesion element with variable surface adhesive force of this disclosure can generate sufficient surface adhesive force by the nanostructures arranged densely in the nanostructure array, and the surface adhesive force may be controlled by adjusting the surface temperature of the nanostructure array.

In summary, the surface temperature of the nanostructure array of the adhesion element with variable surface adhesive force of this disclosure is changed by different applied voltages according to the nanostructure array of the metallic glass material, such that the surface adhesive force is changed. Accordingly, the adhesion element with variable surface adhesive force of this disclosure can be applied to simulate a walking mode of a gecko climbing a wall or a vertical plane.

The above detailed description is merely illustrative in nature and is not intended to limit the embodiments of the subject matter or the application and uses of such embodiments. Moreover, while at least one exemplary embodiment has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made to the function and arrangement of elements without departing from the scope defined by the claims, which include known equivalents and foreseeable equivalents at the time of filing this patent application.

What is claimed is:

1. An adhesion element with variable surface adhesive force for adhering to an object, comprising:
    a substrate;
    a heating layer formed on one side of the substrate, wherein a temperature of the heating layer is changeable by a power supply;
    a buffer layer formed on the heating layer; and a nanostructure array formed on the buffer layer, the nanostructure array being made of a metallic glass material and comprising a plurality of nanostructures which are spaced apart from one another and together form an ordered array, wherein a plurality of gas chambers are formed by the nanostructure array.

2. The adhesion element of claim 1, wherein the heating layer comprises a metallic layer, and the buffer layer comprises a metal oxide layer or a nitride layer.

3. The adhesion element of claim 1, wherein each nanostructure comprises a hollow tubular structure with a central axis perpendicular to a surface of the buffer layer, and one end of the hollow tubular structure is connected to the buffer layer and the other end of the hollow tubular structure is an open end.

4. The adhesion element of claim 3, wherein a diameter of the hollow tubular structure ranges from 10 nm to 100 μm, and a height-to-width ratio of the hollow tubular structure ranges from 1:0.5 to 1:10.

5. The adhesion element of claim 3, wherein a wall thickness-to-diameter ratio of the hollow tubular structure ranges from 1:2 to 1:10.

6. The adhesion element of claim 3, wherein a duty ratio of the plurality of nanostructures ranges from 0.5 to 6.

7. The adhesion element of claim 1, further comprising a power supply unit electrically connected to the heating layer for applying an adjustable voltage to the heating layer.

8. The adhesion element of claim 7, wherein the adjustable voltage ranges from 0.5V to 3V.

9. The adhesion element of claim 7, wherein the surface adhesive force of the nanostructure array to the object is reduced with an increase in the adjustable voltage.

10. The adhesion element of claim 7, wherein under the same adjustable voltage, the surface adhesive force of the nanostructure array to the object during a temperature increase is less than the surface adhesive force of the nanostructure array to the object during a temperature decrease.

11. The adhesion element of claim 1, wherein the metallic glass material comprises at least one material selected from the group consisting of a zirconium-based metallic glass, a titanium-based metallic glass, a palladium-based metallic glass, an iron-based metallic glass, a copper-based metallic glass, a nickel-based metallic glass, an aluminum-based metallic glass, a tungsten-based metallic glass, and a magnesium-based metallic glass.

12. A method of manufacturing the adhesion element with variable surface adhesive force as claimed in claim 1, comprising:
providing a substrate;
forming a heating layer on the substrate;
forming a buffer layer on the heating layer;
forming a photoresist layer on the buffer layer, wherein the photoresist layer comprises a hollow structure array, and the hollow structure array comprises a plurality of hollow structures which pass through from one side of the photoresist layer to the buffer layer;
sputtering a metallic glass material on the photoresist layer to deposit the metallic glass material on a side wall of each hollow structure and a part of the buffer layer defined by the side wall; and
removing the photoresist layer to form a nanostructure array of the metallic glass material, wherein the nanostructure array comprises a plurality of nanostructures which are spaced apart from one another and form an ordered array, and a plurality of gas chambers are formed by the nanostructure array.

13. The method of claim 12, further comprising:
electrically connecting a power supply unit to the heating layer to provide an adjustable voltage to the heating layer.

* * * * *